(12) United States Patent
Somervell et al.

(10) Patent No.: US 8,129,089 B2
(45) Date of Patent: Mar. 6, 2012

(54) USE OF BLENDED SOLVENTS IN DEFECTIVITY PREVENTION

(75) Inventors: Mark H. Somervell, Richardson, TX (US); Benjamen M. Rathsack, Richardson, TX (US); David C. Hall, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/652,870

(22) Filed: Jan. 6, 2010

(65) Prior Publication Data

US 2010/0104975 A1    Apr. 29, 2010

Related U.S. Application Data

(62) Division of application No. 11/111,211, filed on Apr. 21, 2005.

(51) Int. Cl.
*G03F 7/004* (2006.01)
*H01L 21/31* (2006.01)

(52) U.S. Cl. ............... 430/270.1; 430/331; 438/759

(58) Field of Classification Search ............ 430/327, 430/331, 270.1; 438/759
See application file for complete search history.

(56) References Cited

U.S. PATENT DOCUMENTS

| 5,039,594 A | 8/1991 | Durham |
| 5,536,445 A | 7/1996 | Campbell et al. |
| 6,117,623 A * | 9/2000 | Koshiyama et al. ......... 430/331 |
| 6,869,894 B2 | 3/2005 | Moore |
| 7,335,319 B2 * | 2/2008 | Peterson et al. ............. 252/364 |
| 2003/0113673 A1 | 6/2003 | Ahn et al. |
| 2003/0157441 A1 | 8/2003 | Ahn et al. |
| 2003/0227005 A1 | 12/2003 | Peterson et al. |

FOREIGN PATENT DOCUMENTS

WO    2004101651 A1    11/2004

OTHER PUBLICATIONS

Hinsberg, et al.; "Liquid Immersion Lithography—Evaluation of Resist issues"; 2004; pp. 21-32; Proceedings of SPIE vol. 5376; SPIE, Bellingham, WA.

* cited by examiner

*Primary Examiner* — John Chu
(74) *Attorney, Agent, or Firm* — Jacqueline J. Garner; Wade J. Brady III; Frederick J. Telecky Jr.

(57) ABSTRACT

The present invention provides a blended solvent for solubilizing an ultraviolet photoresist. The blended solvent comprises a mixture of from about 5 vol % to about 95 vol % of a first solvent, wherein the first solvent comprises a cyclic ester. A balance of the mixture comprises a second solvent, wherein the second solvent comprises a volatile organic liquid.

10 Claims, 3 Drawing Sheets

USE OF BLENDED SOLVENTS IN DEFECTIVITY PREVENTION

This is a divisional application of Ser. No. 11/111,211, filed Apr. 21, 2005.

TECHNICAL FIELD OF THE INVENTION

The present invention is directed, in general, to a method of manufacturing integrated circuits and a system for manufacturing the same, and more specifically, to a blended solvent to solubilize ultraviolet photoresist material, and a method and system using the blended solvent.

BACKGROUND OF THE INVENTION

The drive to manufacture microelectronic devices having smaller dimensions has lead to the use of photolithography at increasingly shorter wavelengths of light. This in turn has lead to the development of photoresist materials that that are appropriately sensitive to light in the ultraviolet range. Ultraviolet photoresists allow the definition of microelectronic device features having sub-100 nanometer critical dimensions.

Using ultraviolet photoresists in microelectronic device fabrication processes is not without problems however. In some cases, lower than expected yields of microelectronic devices have been obtained when these types of photoresists are used in the device fabrication process. In other instances, the plumbing of tools used to apply ultraviolet photoresists becomes clogged with residual photoresist material resulting in slower device manufacturing throughput.

Accordingly, what is needed in the art is a method and system for manufacturing microelectronic devices that avoid the above-discussed disadvantages associated with conventional methods and systems that use ultraviolet photoresists.

SUMMARY OF THE INVENTION

To address the above-discussed deficiencies of the prior art, the present invention provides in one embodiment, a blended solvent for solubilizing an ultraviolet photoresist. The blended solvent comprises a mixture of a first and second solvent. The first solvent comprises a cyclic ester and the second solvent comprises a volatile organic liquid. The mixture comprises from about 5 vol % to about 95 vol % of the first solvent with a balance of the mixture comprising the second solvent.

Another aspect of the present invention is a method of manufacturing an integrated circuit. The method comprises depositing an ultraviolet resist on a substrate and cleaning the substrate with the blended solvent as described above. The cleaning removes a portion of the ultraviolet resist that is outside of a planned microelectronic device pattern.

Still another embodiment of the present invention is a system for manufacturing an integrated circuit. The system comprises a spin coating tool that comprises a delivery line and a cleaning line. The delivery line is configured to deposit a resist on a substrate. The cleaning line is configured to spray the substrate with the above-described blended solvent to remove a portion of the resist that is outside of a planned microelectronic device pattern.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which.

DETAILED DESCRIPTION

Figure 1:
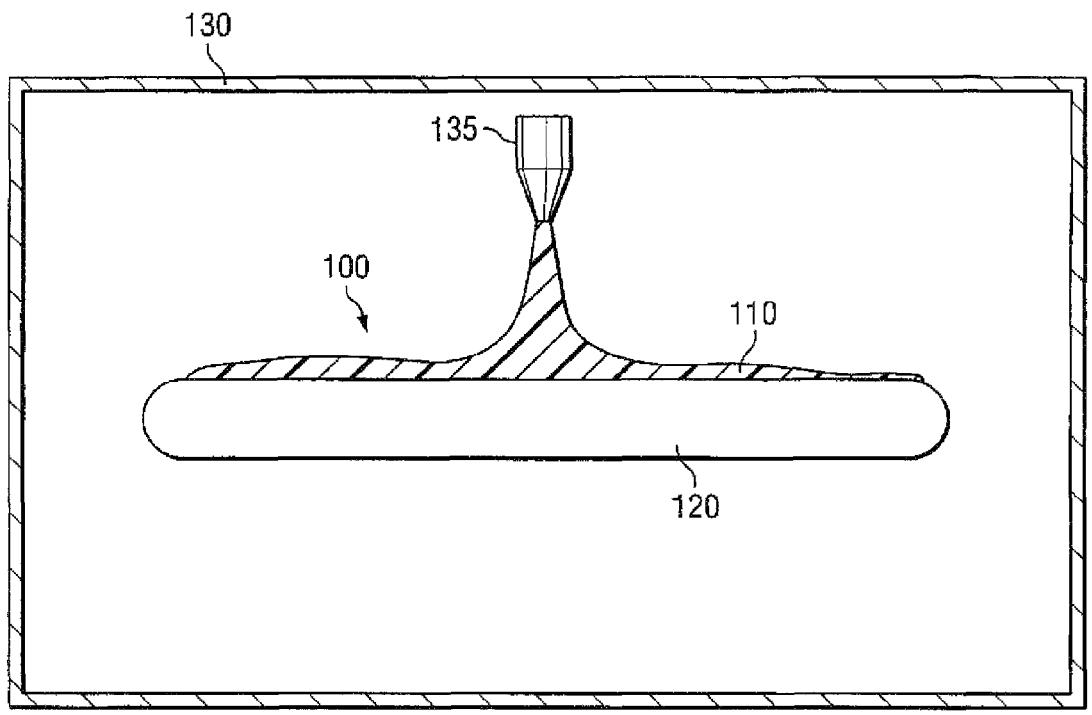
FIGS. 1 to 4 illustrate cross-sectional views of selected steps in an exemplary method of manufacturing an integrated circuit according to the principles of the present invention.

The term ultraviolet photoresist as used herein refers to a photosensitive material that when applied to a substrate and exposed to ultraviolet wavelengths of light, develops into a photolithographic mask portion over the substrate. As well known to those skilled in the art, there are discrete ultraviolet exposure technologies corresponding to particular wavelengths of light emitted by lasers. For instance, conventional lasers used in photolithography typically emit ultraviolet light at wavelengths of 248 nm, 193 nm, or 157 nm. Photoresist that are exposed to these wavelength of light are termed 248 nm resists, 193 nm resists and 157 nm resists, respectively. Of course, the term ultraviolet photoresist would also apply to a resist exposed to other wavelengths of ultraviolet light. Ultraviolet photoresists typically comprise a polymer having acid labile pendant groups that can be deprotected at elevated temperatures and in the presence of an acid typically generated when a photoactive component of the resist is exposed to one of the above-mentioned wavelengths of ultraviolet light.

The present invention benefits from investigations into the cause for poor device yields when using certain ultraviolet photoresists for integrated circuit fabrication. It was discovered that conventional solvents used for removing these resists are inadequate. In particular, it was discovered that conventional solvents do not sufficiently solubilize certain ultraviolet photoresists to provide for their efficient removal during microelectronic device fabrication. Consequently, the residual photoresist remaining on a semiconductor wafer becomes dislodged during various device fabrication steps. The dislodged photoresist lands on portions of the wafer intended for device production, resulting in lower than expected device yields per wafer. Likewise, residual photoresist can remain in tools used to apply the photoresist. Further reductions in device yield occur when the residual photoresist dislodges from the tool and is redeposited on a semiconductor wafer.

The present invention addresses these difficulties by providing, in one embodiment, a blended solvent for solubilizing ultraviolet photoresist material. Because of its high solubility in the blended solvent, the ultraviolet photoresist is efficiently removed during various wafer-cleaning steps. Similarly, the blended solvent is effective at removing ultraviolet photoresist left in tools used for applying the resist to wafers. The blended solvent of the present invention is particularly more efficient at solubilizing 193 nm ultraviolet photoresist materials as compared to conventional solvents. It is contemplated, however, that the blended solvent could also be used to solubilize 157 nm, 248 nm or other ultraviolet photoresists.

The blended solvent comprises a mixture of a first solvent comprising a cyclic ester and a second solvent comprising a volatile organic liquid. The mixture comprises from about 5 vol % to about 95 vol % of the first solvent, and a balance of the mixture comprises the second solvent. The blended solvent is a homogenous mixture of the first and second solvents, which are miscible in each other. A first solvent comprising a plurality of different cyclic ester species and a second solvent comprising a plurality of different volatile organic solvents is also within the scope of the present invention.

The term cyclic ester as used herein refers to any molecule comprising one or more carbon rings that have an ester linkage that forms part of the ring system. The cyclic ester can comprise one or more lactones. As well known to those skilled in the art, lactones have an inner ester of a carboxylic acid formed by intramolecular reaction of hydroxylated or halogenated carboxylic acid with elimination of water. Examples of suitable lactones include -acetolactone, -propiolactone, -butyrolactone, -valerolactone and -caprolactone. It is noted that the above-mentioned lactones have two, three, four, five, and six ring carbons, respectively. In some instances, the cyclic ester comprises a lactone having one or more of the ring carbons substituted with alkyl groups, such as -butyrolactone.

The cyclic ester is particularly effective at solubilizing 193 nm ultraviolet photoresists. In particular, the cyclic ester is effective at solubilizing 193 nm ultraviolet photoresists comprising polymers having pendant groups that comprise esters, and even more preferably, lactone-containing pendant groups. Non-limiting examples of 193 nm ultraviolet photoresists include polymers comprising polyacrylate, polymethylacrylate, or copolymer thereof, having alicyclic pendant groups such as adamantane and -butyrolactone linked to the polymer backbone via ester linkages. One of ordinary skill in the art would be familiar with the structure of other 193 nm ultraviolet photoresists.

Although the cyclic esters of the present invention efficiently solubilize ultraviolet resists, they have insufficient volatility to be rapidly removed during the short period allotted for wafer cleaning (typically less than about 10 seconds). It is therefore desirable to add one or more volatile organic liquid to the cyclic ester to form the blended solvent. The blended solvent has increased volatility as compared to the first solvent alone. In some cases, an additional advantage realized in forming a blended solvent is that lower quantities of the cyclic ester can be used, thereby reducing total material costs.

Preferably, the volatile organic liquid is more volatile than the cyclic ester. To a first approximation, the volatility of an organic liquid is reflected by its boiling point. In some embodiments of the blended solvent, the volatile organic liquid has a boiling point (bp) of less than about 155° C. at about 1 atmosphere of pressure. Other preferred volatile organic liquids have a molecular weight (MW) of about 200 gm/mole or less. Non-limiting examples of preferred volatile organic liquids include propylene glycol monomethylether acetate (bp=146° C.; MW=132 gm/mol), propylene glycol monomethylether (bp=120° C.; MW=90 gm/mol); ethyl-lactate (bp=154° C. gm/mole; MW=118); cyclohexanone (bp=155° C.; MW=98 gm/mole); methyl amyl ketone, (by=151.5 C, MW=114.19 g/mol); and tetrahydrofuran (bp=66° C.; MW=72 gm/mole).

The relative amounts of the first and second solvents are carefully selected to strike a balance between solubilizing the ultraviolet photoresist of interest, providing a sufficiently volatile mixture, and minimizing material costs. For instance, one preferred embodiment of the blended solvent comprises a first solvent of y-butyrolactone and a second solvent of propylene glycol monomethylether acetate. The blended solvent comprises a mixture of about 20 vol % of the first solvent and about 80 vol % of the second solvent.

Another embodiment of the present invention is a method of manufacturing an integrated circuit. FIGS. 1 to 4 illustrate cross-sectional views of selected steps of an exemplary method of manufacturing an integrated circuit 100 according to the principles of the present invention.

Turning first to FIG. 1, illustrated is the partially constructed integrated circuit 100 while depositing an ultraviolet resist 110 on a substrate 120. Deposition using a spin coating tool 130 comprising a delivery line 135 is a preferred method to deposit the ultraviolet resist 110, although any conventional deposition method can be used. Similarly, any conventional ultraviolet resist can be used, however, a 193 nm ultraviolet resist such as described above is preferred. The term substrate 120 as used herein, refers to any conventional material used in microelectronic device fabrication and located on or over a semiconductor wafer, including the semiconductor wafer itself.

Figure 2:
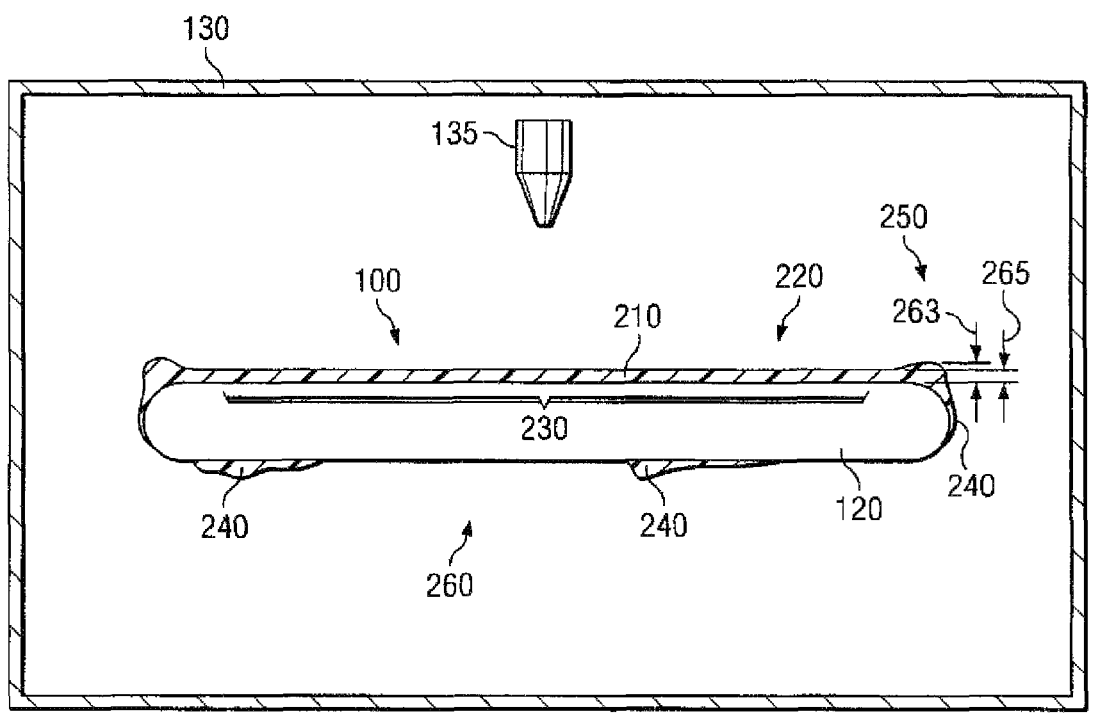

With continuing reference to FIG. 1, FIG. 2, presents the partially completed integrated circuit 100 after completing the resist deposition process. An ultraviolet resist layer 210 lays over the topside 220 of the substrate 100 and corresponds to an area of a planned microelectronic device pattern 230 of the integrated circuit 100. As further illustrated, however, residual portions of ultraviolet resist 240 have also been inadvertently deposited along the beveled region 250 (corresponding to the curved portion of the substrate at its perimeter) and backside 260 of the substrate 120. As illustrated in FIG. 2, in some instances the ultraviolet resist 240 along the beveled region 250 has a substantially larger thickness 263 than a thickness 265 of the ultraviolet resist layer 210 over the substrate's topside 220.

Figure 3:
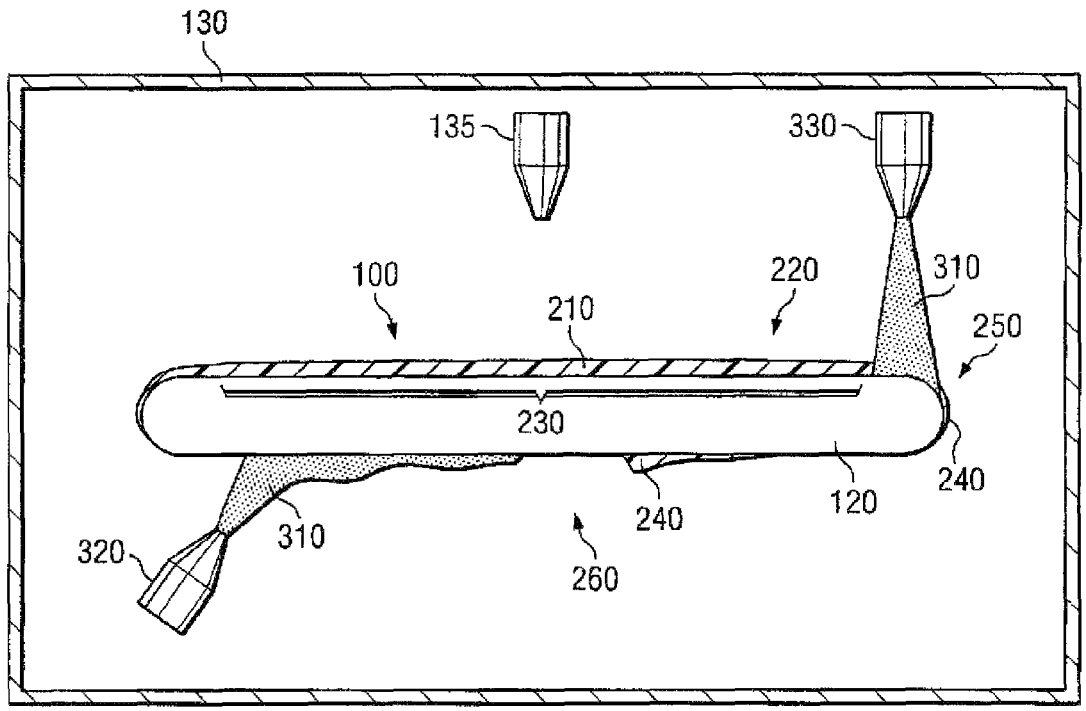
Figure 4:
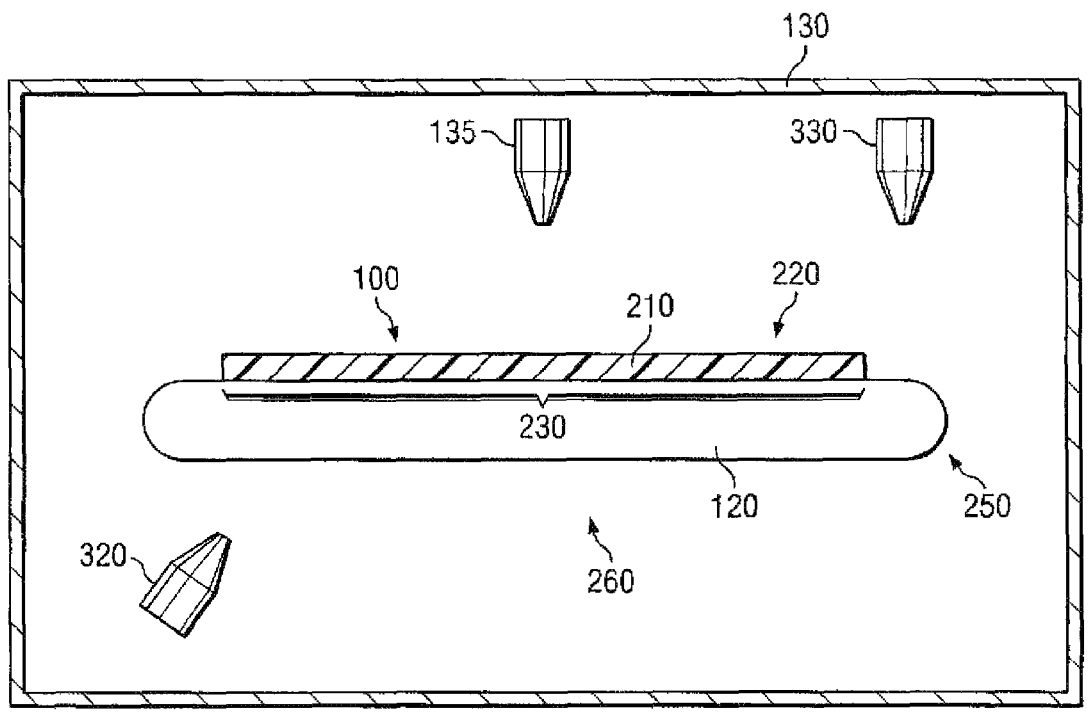

While maintaining reference to FIGS. 1 and 2, FIG. 3 presents the partially completed integrated circuit 100 while cleaning the substrate 120 with a blended solvent 310. Any of the embodiments of the blended solvent 310 discussed above can be used. Cleaning removes portions of the ultraviolet resist 240 that are outside of the planned microelectronic device pattern 230. As further illustrated in FIG. 3, cleaning can comprise rinsing the backside 260 of the substrate 120 with the blended solvent 310. In some preferred embodiments, backside rinsing is facilitated using a cleaning line 320 configured to spray the blended solvent 310 on the backside 260 of the substrate 120.

Cleaning can also comprise the removal of portions of ultraviolet resist 240 located at the beveled region 250 of the substrate 120. Backside rinsing that includes beveled region 240 cleaning is facilitated when the blended solvent 310 has sufficient surface tension to wrap around the beveled region 250 while the substrate 120 is spinning and thereby contact the beveled region 250 of the substrate 100. In some preferred embodiments of the method, backside rinsing also accomplishes a topside edge bead removal of ultraviolet resist 240. This advantageously allows the elimination of a separate step for a topside edge bead removal step to remove ultraviolet resist 240 from the beveled region 250.

In other cases, it is still desirable for topside edge bead removal to be accomplished using a second cleaning line 330 that is configured to spray the perimeter of the substrate 120 with the blended solvent 310, or some cases, a non-blended solvent. The non-blended solvent preferably comprises a volatile organic liquid, such as that used as the second solvent of the blended solvent as discussed above. In some preferred embodiments, for instance, the non-blended solvent comprises propylene glycol monomethylether acetate.

In some preferred embodiments of the method, a conventional optical wafer edge exclusion is performed after the cleaning steps to further exclude the ultraviolet resist 240 from the bevel region 250 of the substrate 120. The above-described cleaning step facilitates a more efficient wafer edge exclusion of the ultraviolet resist 240 from the beveled region 250 by advantageously reducing the increased thickness 263 of ultraviolet resist 240 depicted in FIG. 2. Reducing the thickness 263 of the ultraviolet resist 240 advantageously allows lower energies of broadband illumination to fully expose and thereby remove any remaining ultraviolet resist 240 during optical wafer edge exclusion.

With continuing reference to FIGS. 1 through 3, FIG. 4 illustrates the partially completed integrated circuit 100 after completing the cleaning and optical wafer edge exclusion steps as discussed above. The substrate 120 is substantially devoid of ultraviolet resist in all areas except for the ultraviolet resist layer 210 over the planned microelectronic device pattern 230. The substrate 120 is then subject to additional fabrication steps, such as patterning and ion implantation to form microelectronic devices, forming interlayer dielectric and metal layers etc., to complete the manufacture of the integrated circuit 100.

Figure 5:
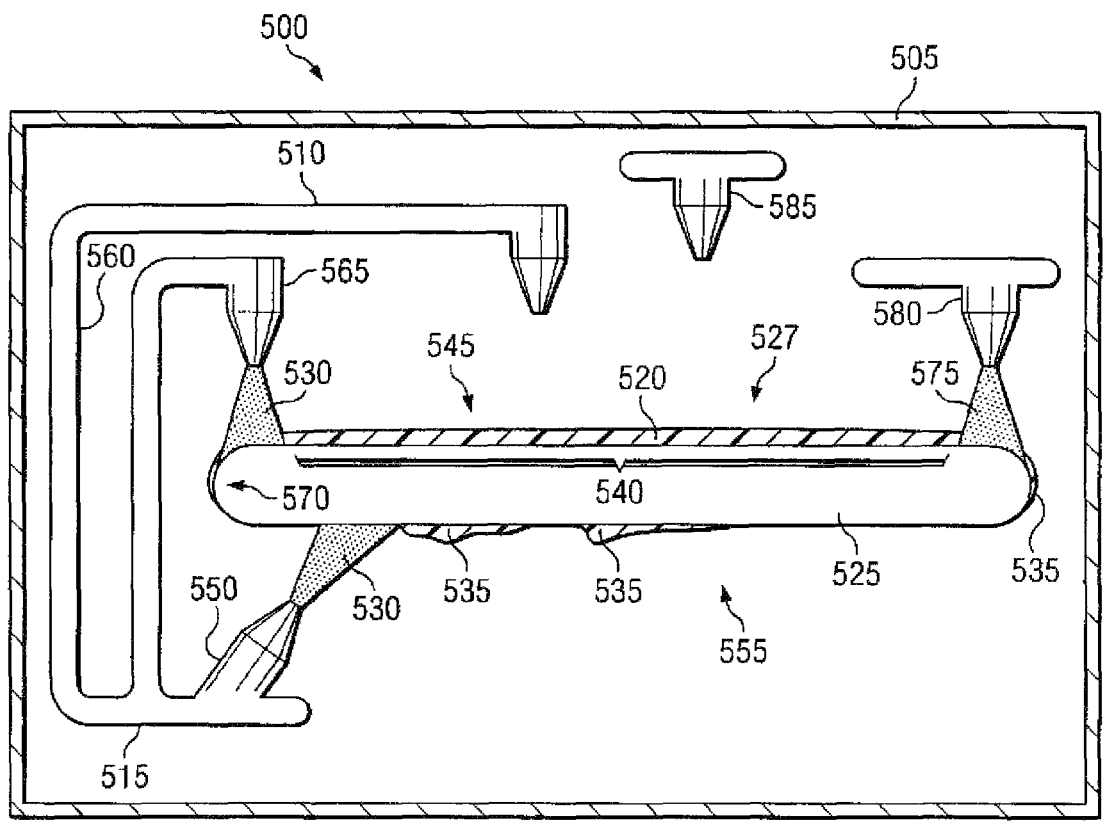
FIG. 5 presents a diagram of an exemplary system for manufacturing an integrated circuit following the principles of the present invention.

Still another embodiment of the present invention is a system for manufacturing an integrated circuit. FIG. 5 presents a diagram of an exemplary system 500 for manufacturing an integrated circuit 502 following the principles of the present invention.

As illustrated in FIG. 5, the system 500 includes a spin coating tool 505 comprising a delivery line 510 and a cleaning line 515. The delivery line 510 is configured to deposit a resist 520 on a substrate 525. For instance, as shown in FIG. 5, the delivery line 510 sprays the topside 527 of a wafer substrate 525 with an ultraviolet resist 520. The cleaning line 515 is configured to spray the substrate 525 with a blended solvent 530 and thereby remove a portion of the resist 535 that is outside of a planned microelectronic device pattern 540 of the integrated circuit 502. The system 500 can apply any of the embodiments of the blended solvent or methods of manufacturing integrated circuits as described above. For instance, the blended solvent 530 comprises a mixture of about 5 vol % to about 95 vol % of a first solvent comprising a cyclic ester and balance a second solvent comprising a volatile organic liquid.

In certain preferred embodiments of the system 500, the cleaning line 515 is configured to perform a backside rinse of the substrate 525 with the blended solvent 530. For example, as shown in FIG. 5, the cleaning line 515 can further include a nozzle 550 that directs the blended solvent 530 to the backside 555 of the substrate 525.

In some embodiments of the system 500, the cleaning line 515 is configured to pump the blended solvent 530 through the delivery line 510 after the resist 520 has been deposited. This advantageously prevents the build-up of resist material in the delivery line 510. As illustrated in FIG. 5, the cleaning line 515 can include a connecting line 560 that couples the blended solvent 530 to the delivery line 510. The connecting line 560 can be configured to direct the blended solvent 530 into the delivery line 510 as part of a process to clean the spin coating tool 505 after a predefined period or predefined number of substrates have been coated with resist.

In still other embodiments of the system 500, the spin coating tool 505 comprises components for performing an edge bead removal of the resist 520 from the substrate 525. In some cases, where the blended solvent 530 is used for edge bead removal, the cleaning line 515 further includes a second nozzle 565 configured to direct the blended solvent 530 to the beveled region 570 of the substrate 525. In other cases, however, it is advantageous to use a non-blended solvent 575 for edge bead removal.

In some instances, it is advantageous for the spin coating tool 505 to also have a second cleaning line 580 configured to perform edge bead removal. In such instances, the second nozzle 565 may not be present or may be present but not used. Using a second cleaning line 580 containing the non-blended solvent 575 advantageously avoids downtime to clean the line 515 that otherwise would be used when transitioning between the blended solvent 530 and the non-blended solvent 575. Of course, the present invention includes embodiments of the spin coating tool 505 where the blended solvent is used in both the first and second cleaning lines 515, 580.

Embodiments of the spin coating tool 505 can also comprises components for pre-wetting the substrate 525. It is thought that pre-wetting adjusts the surface tension of the substrate 525 so that it more readily accepts the resist 520 during spin coating. By facilitating the deposition of resist 520 on the substrate 525 pre-wetting reduces the total amount of resist 520 used for deposition, thereby reducing material costs. Although the blended solvent 530 can be used for pre-wetting, more preferably the non-blended solvent 575 is used. When the non-blended solvent 575 is used in some cases it is advantageous for the spin coating tool 505 to comprise a second cleaning line 580 configured to pre-wet the substrate 525. In other cases the second cleaning line 580 is configured to perform both edge bead removal and pre-wetting. In still other instances, a separate pre-wetting line 585 is used. Any of the above-discussed embodiments of the non-blended solvent can used to accomplish edge bead removal or pre-wetting.

Certain preferred embodiments of the system 500 comprise a photolithography track that includes conventional components to facilitate the formation and patterning of the resist. Such components can comprise a pretreatment chamber, chiller, pre-exposure oven, scanner for exposing the resist, post-exposure oven and developer. One skilled in the art would be familiar with these and other components used in the formation and patterning of resists.

Although the present invention has been described in detail, those skilled in the art should understand that they can make various changes, substitutions and alterations herein without departing from the scope of the invention in its broadest form.

What is claimed is:

1. A method of manufacturing an integrated circuit comprising:
   depositing an ultraviolet resist on a substrate; and cleaning said substrate with a blended solvent to remove a portion of said ultraviolet resist that is outside of a planned microelectronic device pattern, wherein said blended solvent comprises:
   a mixture of from about 5 vol % to about 95 vol % of a first solvent comprising a cyclic ester; and a balance of said mixture comprising a second solvent, wherein said second solvent comprises a volatile organic liquid, wherein said volatile organic liquid is selected from the group consisting of propylene glycol monomethylether acetate, propylene glycol monomethylether, cyclohexanone, methyl amyl ketone, and tetrahydrofuran.

2. The method as recited in claim 1, wherein said cleaning comprises a backside rinse of said ultraviolet resist from said substrate using said blended solvent.

3. The method as recited in claim 2, wherein said backside rinse further accomplishes a topside edge bead removal of said ultraviolet resist from a beveled region of said substrate.

4. The method as recited in claim 1, wherein said cleaning comprises a topside edge bead removal of said ultraviolet resist from a beveled region of said substrate using said blended solvent.

5. The method as recited in claim 1, further includes performing optical wafer edge exclusion after said cleaning, wherein said optical wafer edge exclusion remove said ultraviolet resist from a beveled region of said substrate.

6. The method as recited in claim 1, wherein said cyclic ester comprises one or more lactone.

7. A method of manufacturing an integrated circuit comprising:
depositing an ultraviolet resist on a substrate; and cleaning said substrate with a blended solvent to remove a portion of said ultraviolet resist that is outside of a planned microelectronic device pattern, wherein said blended solvent comprises:
a mixture of from about 5 vol % to about 95 vol % of a first solvent comprising a cyclic ester; and
a balance of said mixture comprising a second solvent, wherein said second solvent comprises a volatile organic liquid, and wherein said first solvent comprises gamma-butyrolactone and said second solvent comprises propylene glycol monomethylether acetate.

8. The method as recited in claim 1, wherein said ultraviolet resist comprises a polymer comprising polyacrylate, polymethylacrylate, or copolymer thereof.

9. The method as recited in claim 1, wherein said polymer comprises a pendant group comprising an ester.

10. The method as recited in claim 9, wherein said pendant group comprises a lactone.

* * * * *